(12) United States Patent
Conte et al.

(10) Patent No.: US 9,099,278 B2
(45) Date of Patent: Aug. 4, 2015

(54) PROTECTIVE ENCLOSURE FOR AN ION GUN, DEVICE FOR DEPOSITING MATERIALS THROUGH VACUUM EVAPORATION COMPRISING SUCH A PROTECTIVE ENCLOSURE AND METHOD FOR DEPOSITING MATERIALS

(75) Inventors: Dominique Conte, Charenton le Pont (FR); Jean-Louis Sirjean, Charenton le Pont (FR)

(73) Assignee: ESSILOR INTERNATIONAL (COMPAGNIE GENERALE D'OPTIQUE), Charenton le Pont (FR)

( * ) Notice: Subject to any disclaimer, the term of this patent is extended or adjusted under 35 U.S.C. 154(b) by 337 days.

(21) Appl. No.: 13/044,007

(22) Filed: Mar. 9, 2011

(65) Prior Publication Data

US 2011/0220487 A1 Sep. 15, 2011

(30) Foreign Application Priority Data

Mar. 9, 2010 (FR) ...................................... 10 51703

(51) Int. Cl.
*C23C 14/00* (2006.01)
*H01J 37/08* (2006.01)
*H01J 37/34* (2006.01)
*H01J 37/09* (2006.01)
*H01J 37/305* (2006.01)

(52) U.S. Cl.
CPC ................. *H01J 37/08* (2013.01); *H01J 37/09* (2013.01); *H01J 37/305* (2013.01); *H01J 37/3488* (2013.01); *H01J 37/3447* (2013.01); *H01J 2237/022* (2013.01); *H01J 2237/0213* (2013.01); *H01J 2237/3151* (2013.01)

(58) Field of Classification Search
CPC H01J 37/3411; H01J 37/3447; H01J 37/3488
See application file for complete search history.

(56) References Cited

U.S. PATENT DOCUMENTS

| 5,878,074 | A | 3/1999 | Buchanan et al. ............... 373/11 |
| 5,883,393 | A | 3/1999 | Tien et al. ................. 250/492.21 |
| 6,251,218 | B1 * | 6/2001 | Fujisawa et al. .......... 156/345.39 |
| 2002/0084426 | A1 * | 7/2002 | Gerlach et al. .............. 250/492.1 |
| 2004/0182699 | A1 * | 9/2004 | Friedrich et al. .......... 204/298.11 |
| 2005/0115923 | A1 * | 6/2005 | Lacan et al. ..................... 216/26 |
| 2005/0238801 | A1 | 10/2005 | Lin et al. ........................ 427/162 |
| 2007/0051622 | A1 * | 3/2007 | Tang et al. ............... 204/298.01 |
| 2008/0213473 | A1 | 9/2008 | Roisin et al. .................. 427/162 |

(Continued)

FOREIGN PATENT DOCUMENTS

| CH | 318 624 | 1/1957 |
| DE | 198 33 718 | 2/2000 |
| EP | 1 160 351 | 12/2001 |

(Continued)

*Primary Examiner* — Keith Henricks
*Assistant Examiner* — Timon Wanga
(74) *Attorney, Agent, or Firm* — Norton Rose Fulbright US LLP

(57) ABSTRACT

The present invention relates to a protective enclosure for an ion gun and to a device for depositing materials through vacuum evaporation comprising such an enclosure and methods of using each. According to the invention, the protective enclosure comprises a side wall intended to surround said ion gun, and an open upper end, said protective enclosure having a longitudinal axis, a truncated tube shape on its open upper end resulting from an inclined surface relative to said longitudinal axis, and having a lower part and an upper part.

17 Claims, 3 Drawing Sheets

(56) References Cited

U.S. PATENT DOCUMENTS

2008/0264340 A1  10/2008  Martinson et al. ............ 118/715
2009/0169766 A1*  7/2009  Takahashi et al. ............ 427/523

FOREIGN PATENT DOCUMENTS

WO     WO 97/30467     8/1997
WO     WO 2004/023508     3/2004

* cited by examiner a)

b)

PROTECTIVE ENCLOSURE FOR AN ION GUN, DEVICE FOR DEPOSITING MATERIALS THROUGH VACUUM EVAPORATION COMPRISING SUCH A PROTECTIVE ENCLOSURE AND METHOD FOR DEPOSITING MATERIALS

BACKGROUND OF THE INVENTION

1. Field of the Invention

The present invention relates to a protective enclosure for an ion gun, a device for depositing materials through vacuum evaporation comprising such a protective enclosure, and a method for depositing materials.

The present invention is more particularly intended to be used in the ophthalmic lens surface treatment, in particular for spectacles.

2. Description of Related Art

Whatever the mineral, organic or composite nature of their matrix, it is known that it is often necessary to apply a surface treatment to ophthalmic lenses once they have been manufactured, so as to reinforce some of their features or to provide them with particular characteristics.

Such treatment may be for example an antireflection coating and/or a hardening treatment.

The present invention relates even more particularly to that case when such treatment is effected by depositing a coating formed with at least one layer of material, and when such a deposition is performed through evaporation, and, very especially, through vacuum evaporation.

Most of the time, said coating is a multilayer coating, that is to say a coating involving stacking a plurality of layers on each other.

The various layers that are thus implemented may be made of different materials, of the same materials deposited according to various thicknesses, or even of the same materials coated according to similar thicknesses. In the latter case, the layers are deposited with different evaporation parameters so that their physicochemical properties be different.

For example, for an antireflection coating, the usual practice consists in forming a multilayer stack comprising low refractive index layers alternating with high refractive index layers and one hydrophobic layer.

Such an antireflection coating is formed in a device for depositing materials through vacuum evaporation, such as illustrated on FIG. 1 illustrating a known material deposition device.

The device for depositing materials through vacuum evaporation comprises a treating chamber 10 defined by side walls 11, a substrate holder 12, an ion gun 2 comprising an outlet 13 that is able to generate an ion beam 14 directed towards the substrate holder 12, a material source 15a (typically metal oxides and/or silica) that can evaporate through electron bombardment 15c, an electron gun 15b that is able to bombard with electrons said material source 15a to generate an evaporated material beam 17 directed towards the substrate holder 12, a gun cover 18 rotatably movable between a close position a) and an open position b) releasing the ion gun outlet 2, and a material source 16 that can evaporate by the Joule effect (typically hydrophobic materials), Movable covers (not shown on FIG. 1) are positioned above the material sources 15a and 16.

The covers cover up the sources as long as the expected temperature for evaporating the material to be evaporated has not been reached. Once it has been reached, the covers are removed and the material deposition may start.

Most of the time, a great number of substrates are simultaneously treated. The substrate holder, which comes as a portion of a sphere, is pivotally mounted, and has a plurality of locations suitable to receive each a substrate to be treated. The locations are distributed around the rotation axis of the substrate holder.

Generally, the material source 15a is made of a support onto which the material to be evaporated is placed, for example a crucible or a plate. The evaporation of the material is most of the time due to an electron bombardment generated by the electron gun 15b.

The treatment based on an ion gun aims either at preparing the surface of the substrate prior to depositing a layer (a so called IPC treatment for "Ion Pre Cleaning"), or, when depositing a layer, at making it denser (a so called IAD method for "Ion Aided Deposition"), at oxidizing it or making it transparent.

However, depositing materials from a material source and the treatment using an ion gun lead to soil problems both on the walls of the treating chamber and on the ion gun.

Indeed, the beam of materials that are evaporating from the evaporation source 15a comes as a broad cone, thus soiling both the walls of the treating chamber and the ion gun.

It is known that it is possible to control the angle or the width of the evaporating cone by modifying the evaporated material flow rate. It is possible to make the crucible size and/or the electron gun power vary, for example.

However, such control is hardly obtained in practice because changing these parameters, which are calibrated to obtain a desired deposition quality, may be detrimental to the deposition quality.

It is therefore almost impossible to direct the beam of evaporated materials or the evaporating cone solely towards the specimen carrier, in order to avoid a pollution of the side walls of the treating chamber and the ion gun.

Similarly, the evaporation of materials obtained from the material source resulting from the Joule effect 16 also causes a pollution of the walls of the vacuum chamber and of the ion gun.

A further problem is due, when using the ion gun, to the occurrence of soils which essentially form inside the ion gun.

The origins of such soils are highly varied. When the ion gun works normally, a parasite phenomenon of tungsten omnidirectional cathode sputtering (material forming the cathode) occurs, as well as a cathode sputtering of the material forming the diffuser (gas distributor, typically in stainless steel, titanium, carbon, tungsten, or tantalum . . . ) and/or of the anode of the ion gun.

An oxidation phenomenon also occurs when air is allowed to come in at the end of the layer deposition because the gun is extremely hot.

These soils do settle onto the ion gun. They are detrimental to the good functioning of the same and to deposition stable operating conditions.

The most heavily soiled parts of the ion gun are the lid, the upper and lower anode supports, the diffuser (titanium gas distributor), the anode and, to a lesser extent, the securing screws of these parts.

Prior to carrying out the ion beam emission onto the substrates, the ion gun is submitted to a priming step, during which a stainless steel cover is positioned above the ion gun. During this step, the ions emitted by the ion gun hit the lower surface of the cover and may cause a stainless steel sputtering.

The soils, generated by the ion gun, do settle onto fixtures, the false plate and the side walls of the treating chamber, and do accumulate with the soils generated by the evaporation sources. On the other hand, during the ion gun operation and when the cover is open, ions are emitted towards the substrates (IPC, IAD steps . . . ) but also towards the side walls of the treating chamber, which may cause, under some conditions:
- the uncontrolled sputtering of the materials previously deposited onto these side walls. Such material uncontrolled sputtering leads to a pollution of the substrates, the interfaces and the stacks;
- the ion reflection against the substrates, having a lower and uncontrollable energy.

The soils generated by both the ion gun and the material evaporation sources onto the side walls of the treating chamber and the ion gun make it necessary to perform a demounting and a regular cleaning thereof.

Such cleaning comprises a sand blasting of the treating chamber walls and of the ion gun parts. Typically, such cleaning operation is performed approximately every 32 evaporation cycles to the maximum, or even more frequently for methods comprising IAD steps, and leads to the shutdown of the material depositing device.

In addition, once the ion gun and the walls of the treating chamber have been reassembled, it is necessary for the deposition device to be operational, to perform a degassing for at least 30 min so as to desorb the gases that are accumulated onto the large-sized side walls of the treating chamber.

These cleaning operations cause long-lasting and expensive maintenance times during which the deposition device is unserviceable.

SUMMARY OF THE INVENTION

It is an object of the present invention to provide a means enabling to limit these maintenance periods. The present invention aims at the previously mentioned objective by providing a protective enclosure for an ion gun for use with a device for depositing materials through vacuum evaporation enabling to limit the soil formation on a major part of the treating chamber side walls and on the ion gun.

The invention makes it possible to perform an increased number of material evaporation cycles between two cleaning operations of the treating chamber side walls.

According to the invention, the protective enclosure comprises a side wall intended to surround said ion gun, and an open upper end, said protective enclosure having a longitudinal axis, a truncated tube shape on its open upper end resulting from an inclined surface relative to said longitudinal axis, and having a lower part and an upper part.

In various possible embodiments, the present invention also relates to the following characteristics which will be considered alone or in any technically feasible combination and which, for each of them, bring specific benefits:
- the protective enclosure has a truncated tube shape on its open upper end because of an inclined surface that is curved in the opposite direction relative to said open upper end,
- the protective enclosure open upper end has a lower section that is substantially parallel to a perpendicular plane relative to the protective enclosure longitudinal axis, and an upper section that is inclined relative to said lower section, where said sections join together by forming an angle,
- the protective enclosure comprises a base provided with a hole through which the ion gun can pass.

The invention also relates to a device for depositing materials through vacuum evaporation comprising a treating chamber that is at least defined by side walls, said treating chamber comprising a substrate holder, an ion gun positioned close to one of the side walls of the treating chamber, and comprising an outlet that is able to generate an ion beam directed towards the substrate holder, a material evaporation source, and a movable gun cover, preferably rotatably, between a close position a) and an open position b) of the ion gun outlet.

The axis of the ion gun may be parallel to the axis of rotation of the substrate holder, or the axis of the ion gun and of the substrate holder may form an acute angle to one another, ranging typically from 10° to 30°, more preferably from 20° to 30°.

According to the invention, said ion gun is surrounded by a protective enclosure such as previously defined, said protective enclosure being oriented so that the protective enclosure upper part be positioned along one of the treating chamber side walls, and so that the protective enclosure open upper end be directed towards the substrate holder.

In various possible embodiments, the present invention also relates to the following characteristics which will be considered alone or in any technically feasible combination and which, for each of them, bring specific benefits:
- the height of the protective enclosure lower part is both higher than the ion gun height and adapted so that the protective enclosure lower part does not prevent the ion beam from reaching the substrate holder,
- the deposition device comprises an electron gun that is able to bombard with electrons said material evaporation source to generate an evaporated material beam directed towards the substrate holder, the height of the protective enclosure lower part being adapted so that the protective enclosure lower part does not prevent neither the ion beam nor the evaporated material beam from reaching the substrate holder,
- the ion gun cover is positioned inside the protective enclosure, the gun cover height being lower than that of the protective enclosure lower part,
- the side wall of the protective enclosure comprises an elongated slot designed in such a way that the gun cover can pass through it when switching from the close position a) to the open position b) of the ion gun outlet, said cover being movable in a plane that is substantially perpendicular to the protective enclosure longitudinal axis,
- the gun cover is at least partially outside the protective enclosure when the ion gun outlet is in the open position b),
- the gun cover is a flat disk having a size close to that of the ion gun, and at least sufficient for covering up the ion gun outlet,
- the protective enclosure acts as a mask for reducing the solid angle of the ion cone emitted towards the substrate holder and for limiting the ion emission towards the treating chamber side walls.

The invention also relates to a method for depositing materials onto substrates through vacuum evaporation.

According to the invention, the materials are evaporated and deposited onto the substrates in a deposition device such as previously defined.

Thus, the invention provides a protective enclosure for an ion gun for use with a device for depositing materials through vacuum evaporation enabling to limit the soil formation onto the side walls of the treating chamber and on the ion gun.

The invention provides a protection for both the ion gun, the gun cover and one of the side walls of the treating chamber against pollution resulting from the material evaporation cone.

The invention provides a further protection, when the ion gun operates with cover, to the rest of the treating chamber against pollution generated by the ion gun, by limiting the pollutants within the protective enclosure lower part. The soils, generated by the ion gun and by the cover thereof are confined within the protective enclosure.

During the step of treating the substrates with the ion gun, the protective enclosure also acts as a mask and thus reduces the solid angle of the ion cone emitted towards the substrate holder. There are less ions to be emitted onto the treating chamber side walls.

The protective enclosure is easily demountable. It may be dismantled every day for a regular cleaning. The sand blasting time therefore is short (around 1 minute).

It is thus possible to carry out a higher number of material evaporation cycles between two cleaning operations of the treating chamber side walls.

Surprisingly, the invention makes it possible to carry out 96 process cycles with long-lasting IAD steps between two cleaning operations of the treating chamber side walls, versus 32 process cycles without any IAD step, or with short IAD steps, using a deposition device of the prior art, or even less than 32 cycles with methods having long-lasting IAD steps. A single daily cleaning of the protective enclosure is performed.

The time during which the treating chamber is unserviceable is drastically reduced.

In addition, by using two protective enclosures, it is possible to carry out the cleaning operation as a background task.

The invention also relates to a method for depositing materials through vacuum evaporation.

According to the invention, the materials are deposited onto substrates in a deposition device such as previously defined.

BRIEF DESCRIPTION OF THE DRAWINGS

The present invention will be now described in more detail, but in a non limitative manner, by referring to the appended figures amongst which.

DETAILED DESCRIPTION

Figure 1:
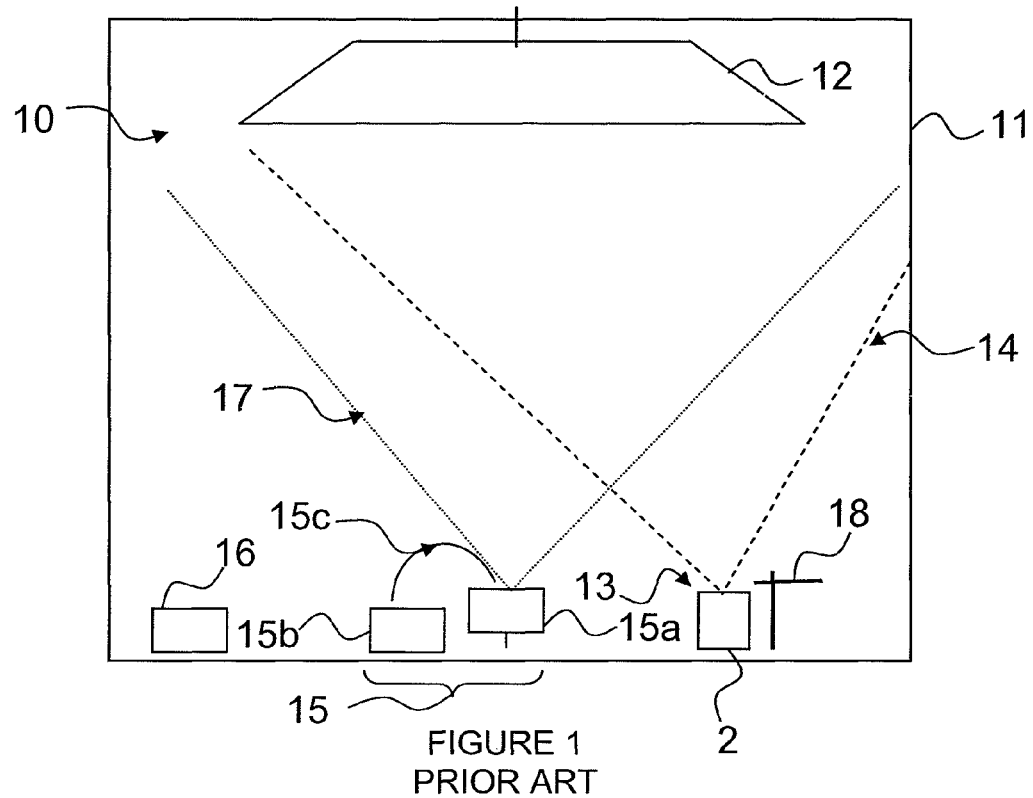
FIG. 1 diagrammatically illustrates a device for depositing materials through vacuum evaporation of the prior art.

FIG. 1 diagrammatically illustrates a device for depositing materials through vacuum evaporation of the prior art.

This device for depositing materials through vacuum evaporation comprises a treating chamber 10 defined by side walls 11, a substrate holder 12, an ion gun 2 positioned close to one of the side walls 11 of the treating chamber, and comprising an outlet 13 that is able to generate an ion beam 14 directed towards the substrate holder 12.

The device for depositing materials through vacuum evaporation comprises at least one material evaporation source 15a, 16, which may be a Joule effect-based material evaporation source 16 or a material evaporation source 15a (a crucible for example) intended to be electronically bombarded with an electron gun 15b to make the material evaporate.

In this example, the material deposition device comprises a Joule effect-based material evaporation source 16, a material evaporation source 15a intended to be electronically bombarded, an electron gun 15b, and a cover ion gun 18 rotatably movable between a close position a) and an open position b) of the ion gun outlet 2. These elements are embedded within a support 23 (or a plate).

The electron gun 15b is able to bombard the material source 15a with electrons so as to generate an evaporated material beam 17 directed towards the substrate holder 12.

The beam of evaporated materials arisen from the material evaporation source and resulting from the Joule effect 16 comes as an evaporating cone (not shown).

In FIG. 1, the material evaporation source 15a and the electron gun 15b are located in the middle of the treating chamber, and the Joule effect-based material evaporation source 16 is in the periphery thereof. As an alternative, their respective locations may be reversed.

As appropriate, it is also possible to operate with a single material evaporation source 15a, 16.

As previously mentioned, such a deposition device causes soil problems both on the walls of the treating chamber and on the ion gun, leading to long-lasting and expensive cleaning times and above all to a pollution of the ion gun.

Figure 2:
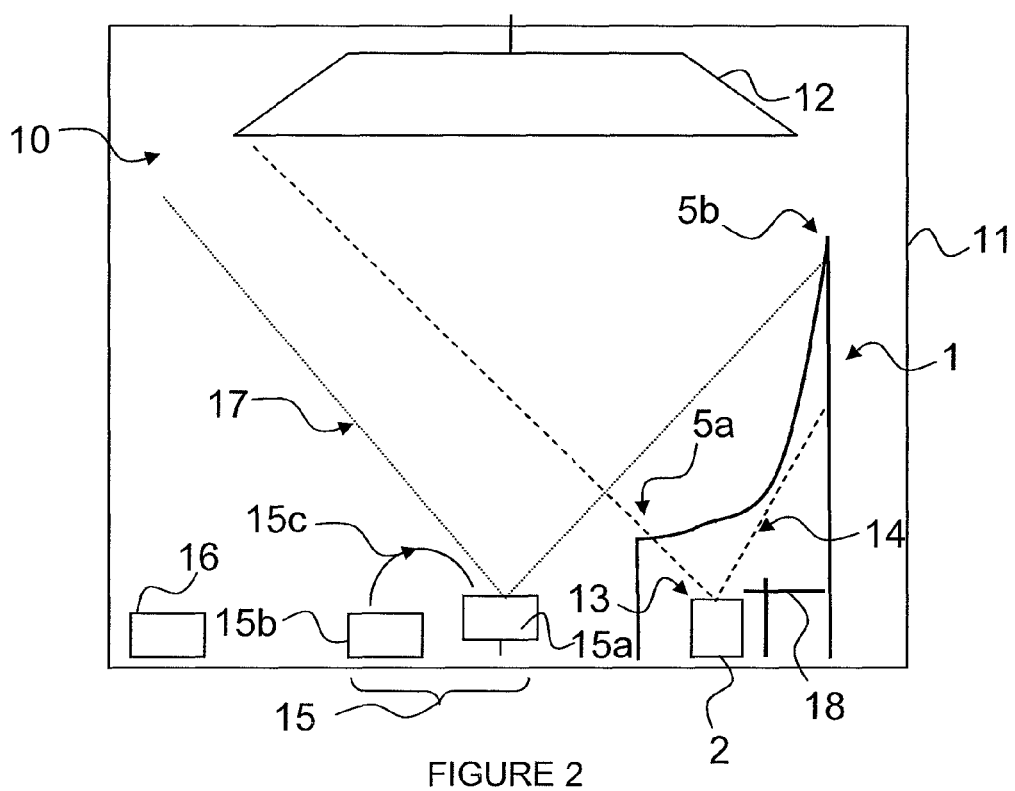
FIG. 2 diagrammatically illustrates a device for depositing materials through vacuum evaporation, according to one embodiment of the invention.

The device for depositing materials through vacuum evaporation on FIG. 2 illustrating one possible embodiment of the invention, overcomes these drawbacks.

Such device for depositing materials through vacuum evaporation comprises all the previously mentioned elements of FIG. 1.

In addition it comprises a protective enclosure 1 for an ion gun 2 with a side wall 3 intended to surround the ion gun 2, and an open upper end 4.

The protective enclosure 1 has a longitudinal axis 20, and a truncated tube shape on its open upper end 4 due to the surface inclined relative to the longitudinal axis 20. The protective enclosure 1 comprises an upper end edge 5, a lower part 5a, and an upper part 5b. This inclined surface may have various shapes. It may be curved or flat, for example. The upper end edge 5 defines the aperture of the protective enclosure 1 which is oriented towards the substrate holder.

In other words, the protective enclosure 1 has a general beveled shape or looks like a mitre.

According to one possible embodiment of the invention, the open upper end 4 of the protective enclosure 1 has a lower section 6a substantially parallel to a plane that is perpendicular to the longitudinal axis 20 of the protective enclosure 1, and an upper section 6b inclined relative to the lower section 6a. The sections 6a, 6b join together by forming an angle 7.

As an alternative, the lower section 6a might not be parallel to the plane that is perpendicular to the longitudinal axis 20 of the protective enclosure 1 and may be inclined relative to such plane.

The plane that is perpendicular to the longitudinal axis 20 of the protective enclosure 1 in fact merges with the horizontal plane when the protective enclosure 1 surrounds the ion gun.

The protective enclosure 1 is preferably cylindrical and is centered as compared to the ion gun.

The protective enclosure 1 comprises a cylindrical base 8 provided with a hole 9 through which the ion gun 2 can pass. The protective enclosure 1 is rigid and made of non magnetic stainless steel.

Preferably, the maximum diameter of the protective enclosure does not exceed 3× the ion gun diameter and is typically approximately 2 times as high as the ion gun diameter.

When the ion gun 2 is surrounded by the protective enclosure 1, the latter is arranged in such a way that the upper part 5b of the enclosure is positioned near to or along one of the side walls 11 of the treating chamber 10.

The function of this upper part 5b is to protect one of the side walls 11 against the soils coming from the material evaporation sources 15a, 16 and of the ion gun 2.

Figure 3:
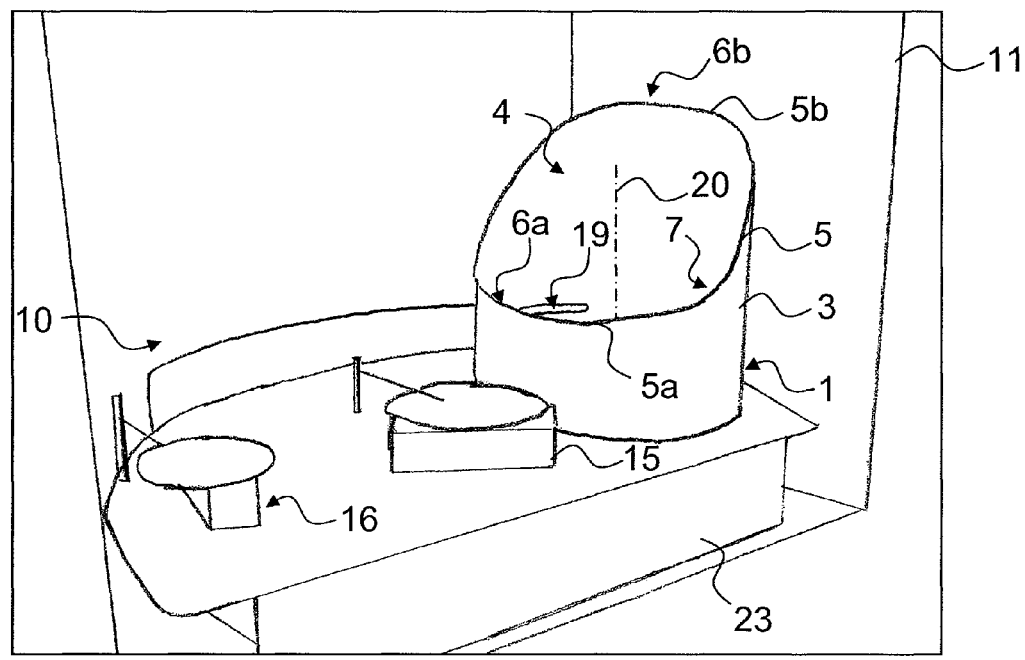
FIG. 3 shows a three-dimensional view of such deposition device.
Figure 4:
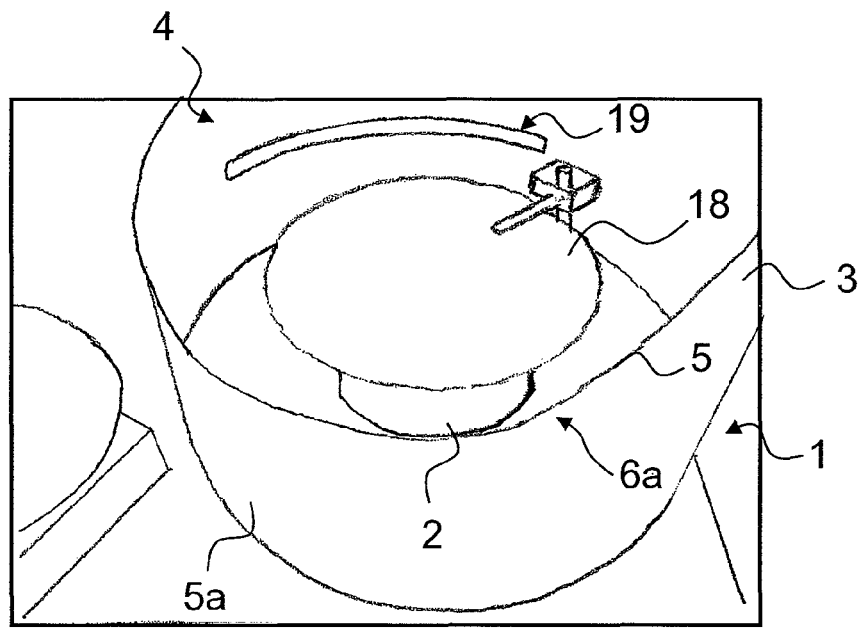
FIG. 4 is a detail of a protective enclosure for an ion gun when the gun cover is in close position a)
Figure 5:
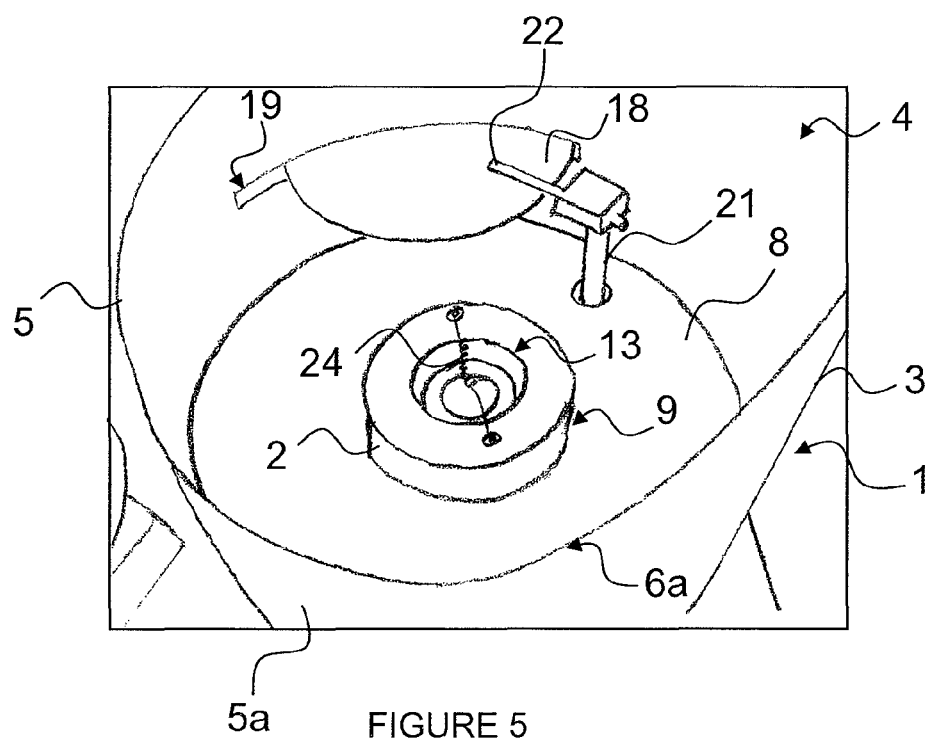
FIG. 5 is a detail of a protective enclosure for an ion gun when the gun cover is in open position b).

The protective enclosure 1 lower part 5a substantially faces the evaporation assembly 15 formed of the material source 15a and of the ion gun 15b (the elements numbered 15a and 15b are not shown on FIG. 3).

The open upper end 4 of the protective enclosure 1 is directed towards the substrate holder 12.

The height of the protective enclosure 1 lower part 5a is both higher than the ion gun 2 height and adapted so that the lower part 5a of the enclosure does neither cut the ion beam 14 nor the evaporated material beam 17 which are directed towards the substrate holder.

The height of the lower part 5a of the enclosure should not be higher than a maximum height for which neither the ion beam 14 nor the evaporated material beam 17 directed towards the substrate holder are cut.

Such configuration enables the protective enclosure 1 to protect the ion gun from the soils coming from the material evaporation sources 15a, 16.

The gun cover 18 is positioned inside the protective enclosure 1. The gun cover height 18 is lower than that of the lower part 5a of the upper end edge of the enclosure.

The side wall 3 of the protective enclosure 1 comprises an elongated slot 19 through which the gun cover 18 can pass when switching from the close position a) to the open position b) of the ion gun outlet 13. The gun cover 18 is movable in a plane that is substantially perpendicular to the longitudinal axis 20 of the protective enclosure 1 horizontal plane.

The slot 19 is substantially perpendicular to the longitudinal axis 20 of the protective enclosure 1.

The gun cover 18 is partially outside the protective enclosure 1 when the ion gun outlet is in the open position b).

The gun cover 18 is a flat disk in stainless steel having a size ranging from the ion gun 2 size to the protective enclosure 1 size. Other shapes may also be suitable.

For example, the protective enclosure 1 may be cylindrical and have a diameter of 40 cm, and the ion gun 2 which has a cylindrical body, may have a diameter of 18 cm. In such a case and as a rule, the diameter of the gun cover 18 does range from the one of the ion gun 2 to that of the protective enclosure 1. The diameter of the gun cover 18 is close to that of the ion gun 2, and at least sufficient for covering up the ion gun outlet 13.

The height positioning of the ion gun within the protective enclosure is such that the difference between the protective enclosure lower part and the upper part of the ion gun may be typically of 95 mm. The upper part of the gun is that of the gun filament 24 (cathode).

The ion gun may have an axis that is aligned with the longitudinal axis 20 of the protective enclosure or may form an angle with it, varying from 10° to 30°, preferably from 20° to 30°.

The height of the protective enclosure 1 lower part 5a is of 170 mm and the height of the protective enclosure 1 upper part 5b is of 465 mm.

For an ion gun of the Mark II type, the ion gun extends over 75 mm, i.e. extends over almost its full length within the protective enclosure, from the base 8 of the protective enclosure 1.

The gun cover 18 is positioned at height 135 mm relative to the base 8 of the protective enclosure 1.

The gun cover 18 is actuated by rotating means comprising an axis of rotation 21 substantially parallel to the longitudinal axis 20 of the protective enclosure 1. Such axis of rotation 21 is connected to the cover gun 18 by an arm 22 that is substantially perpendicular to the axis of rotation 21. The axis of rotation 21 and the arm 22 are arranged inside the protective enclosure 1.

The present invention provides a means for limiting the maintenance time which consists in a protective enclosure for an ion gun for use with a device for depositing materials through vacuum evaporation making it possible to limit the soil formation on the side walls of the treating chamber and on the ion gun.

It is thus possible to perform a higher number of material evaporation cycles between two cleaning operations of the treating chamber side walls (3 times higher).

An example is given hereunder for comparing the results obtained with a device for depositing materials through vacuum evaporation of the prior art, and a device for depositing materials through vacuum evaporation provided with a protective enclosure 1, according to the invention.

Comparative Example

For this comparative example, a method has been used for depositing an antireflection stack onto a substrate, corresponding to Example 5 of the European patent application EP 2 122 392.

This known deposition method was carried out with a device for depositing materials through vacuum evaporation provided with a protective enclosure according to the invention (device 1), and a device for depositing materials through vacuum evaporation with no enclosure (device 2).

The antireflection stack consisted in:
a $TiO_2$ thick layer which upon depositing was submitted to an oxygen-ion assistance (ion gun set at 3.5 A 140 V);
a $ZrO_2$ layer, adjacent to the $TiO_2$ layer, this $ZrO_2$ layer being also deposited under ion assistance;
a ITO (Indium Tin Oxide) layer with the ion gun set as above (3.5 A 140 V).

The deposition device was a Satis 1200 DLF apparatus fitted with an electron gun ESV 14 (8 kV) for oxide evaporation, with a Joule effect crucible for depositing a hydrophobic layer, and with a Weeco Mark II TM ion gun (diameter 18 cm) for the substrate and sub-layer surface preparation preliminary phases (IPC) using argon ions, for depositing layers under ion assistance (IAD).

Listed in the following table are the numbers of runs that can be carried out without any dysfunction, whether which method, with or without a protective enclosure, is used.

Said dysfunction refers to the impossibility to maintain fixed parameters during evaporation and/or to reproducibility problems.

A run refers to a cycle comprising the deposition of a stack on the convex side and to a cycle comprising the deposition of a stack on the concave side of the substrate to be treated.

|  | Number of runs free of any ion gun dysfunction |
|---|---|
| Device 1 (with the protective enclosure) | 96 runs |
| Device 2 (without the protective enclosure) | 32 runs |

The invention claimed is:

1. A device for depositing materials through vacuum evaporation comprising:
   a treating chamber having a substrate holder;
   an ion gun having an outlet configured to direct an ion beam towards the substrate holder;
   a protective enclosure for the ion gun comprising:
      at least one curved side wall surrounding the ion gun;
      an open upper end defining an opening; and
      a longitudinal axis;
      where the side wall forms a truncated tube such that:
         the opening of the open upper end of the protective enclosure defines an incline relative to the longitudinal axis; and
         the open upper end has an upper section and a lower section such that at least a portion of the opening is disposed at a non-perpendicular angle relative to the longitudinal axis; and
         an innermost surface of the side wall is parallel to the longitudinal axis.

2. The device of claim 1, wherein the incline of the protective enclosure is curved inwardly relative to the open upper end of the protective enclosure.

3. The device of claim 1, wherein the incline of the protective enclosure comprises:
   a substantially planar section substantially perpendicular to the longitudinal axis of the protective enclosure; and
   a curved section protruding away from the substantially planar section and curved inwardly relative to the open upper end of the protective enclosure;
   where the substantially planar section and the curved section are joined to form an angle.

4. The device of claim 1, wherein the protective enclosure comprises a base defining a hole through which the ion gun can pass.

5. The device of claim 1, where:
   the treating chamber is defined at least by side walls;
   the ion gun is positioned close to one of the side walls of the treating chamber; and
   the device comprises:
      at least one material evaporation source; and
      a gun cover that is movable between an open position and a close position in which the gun cover covers the ion gun outlet.

6. The device of claim 5, wherein the gun cover is rotatably movable between the close position and the open position.

7. The device of claim 5, wherein the incline of the protective enclosure is curved inwardly relative to the open upper end of the protective enclosure.

8. The device of claim 5, wherein the incline of the protective enclosure comprises:
   a substantially planar section substantially perpendicular to the longitudinal axis of the protective enclosure; and
   a curved section protruding away from the substantially planar section and curved inwardly relative to the open upper end of the protective enclosure;
   where the substantially planar section and the curved section are joined to form an angle.

9. The device of claim 5, wherein the protective enclosure comprises a base defining a hole through which the ion gun can pass during use.

10. The device of claim 5, wherein:
   the side wall of the protective enclosure extends beyond the ion gun; and
   the incline of the protective enclosure is configured to allow the ion beam to reach the substrate holder during use.

11. The device of claim 5, further comprising:
   an electron gun configured to provide electrons to the at least one material evaporation source to generate an evaporated material beam directed towards the substrate holder;
   where the incline of the protective enclosure configured to allow both the ion beam and the evaporated material beam to reach the substrate holder.

12. The device of claim 5, wherein the gun cover is positioned inside of the protective enclosure and the side wall of the protective enclosure extends beyond the gun cover.

13. The device of claim 5, wherein:
   the side wall of the protective enclosure comprises an elongated slot through which the gun cover can pass when moving between the close position and the open position; and
   the gun cover is movable in a plane that is substantially perpendicular to the longitudinal axis of the protective enclosure.

14. The device of claim 5, wherein the gun cover is a flat disk having a size sufficient for covering up the ion gun outlet.

15. The device of claim 5, wherein the protective enclosure acts as a mask for reducing a solid angle of the ion cone emitted towards the substrate holder and for limiting ion emission towards the treating chamber side walls during use.

16. A method for depositing materials onto a substrate through vacuum evaporation comprising:
   obtaining a device for depositing materials through vacuum evaporation comprising:
      a treating chamber having a substrate holder;
      an ion gun having an outlet configured to direct an ion beam towards the substrate holder;
      a protective enclosure for the ion gun comprising:
         at least one curved side wall surrounding the ion gun;
         an open upper end defining an opening; and
         a longitudinal axis;
         where the sidewall forms a truncated tube such that:
            the opening of the open upper end of the protective enclosure defines an incline relative to the longitudinal axis; and
            the open upper end has an upper section and a lower section such that at least a portion of the opening is disposed at a non-perpendicular angle relative to the longitudinal axis; and
   using the device to evaporate a material and deposit it onto the substrate.

17. A device for depositing materials through vacuum evaporation comprising:
   an ion gun having an outlet configured to emit an ion cone having an apex angle;
   a protective enclosure for the ion gun comprising:
      at least one side wall surrounding the ion gun;
      an open upper end defining an opening; and
      a longitudinal axis;
      where the side wall forms a truncated tube such that:
         the opening of the open upper end of the protective enclosure defines an incline relative to the longitudinal axis;
         the open upper end has an upper section and a lower section such that at least a portion of the opening is disposed at a non-perpendicular angle relative to the longitudinal axis; and
      where the protective enclosure is configured to reduce the apex angle of the ion cone.

* * * * *